（12） United States Patent
Honda et al.

(10) Patent No.: US 7,116,136 B2
(45) Date of Patent: Oct. 3, 2006

(54) GATE DRIVER WITH LEVEL SHIFT BETWEEN STATIC WELLS WITH NO POWER SUPPLY

(75) Inventors: Jun Honda, El Segundo, CA (US); Xiao-chang Cheng, San Jose, CA (US)

(73) Assignee: International Rectifier Corporation, El Segundo, CA (US)

( * ) Notice: Subject to any disclaimer, the term of this patent is extended or adjusted under 35 U.S.C. 154(b) by 13 days.

(21) Appl. No.: 11/013,973

(22) Filed: Dec. 16, 2004

(65) Prior Publication Data

US 2005/0151568 A1 Jul. 14, 2005

Related U.S. Application Data

(60) Provisional application No. 60/530,319, filed on Dec. 16, 2003.

(51) Int. Cl.
*H03B 1/00* (2006.01)
*H03L 5/00* (2006.01)
(52) U.S. Cl. ........................ 327/108; 327/333
(58) Field of Classification Search ............. 327/108, 327/112, 365, 374–377, 333
See application file for complete search history.

(56) References Cited

U.S. PATENT DOCUMENTS

| 5,552,731 A * | 9/1996 | Diazzi et al. ............... 327/109 |
| 6,232,833 B1 * | 5/2001 | Pullen ........................ 330/10 |
| 6,603,291 B1 * | 8/2003 | Wheeler et al. ............ 323/224 |
| 2002/0105311 A1 * | 8/2002 | Rutter et al. ................ 323/283 |

* cited by examiner

*Primary Examiner*—Dinh T. Le
(74) *Attorney, Agent, or Firm*—Ostrolenk, Faber, Gerb & Soffen, LLP

(57) ABSTRACT

A control terminal driver IC for a switching circuit having series connected high and low side output transistors, an associated split power supply and a floating input, the gate drive IC, an exemplary, but non-limiting, example of which is a Class D audio amplifier. The IC includes an input circuit, a voltage to current converter connected to the input circuit, a level shifter formed in a mid well of the IC, which is operative to transfer the input signal to the low side without the need for a power supply input to the mid well, a current to voltage converter on the low side coupled to the level shifter; and an output circuit which is operative to generate control terminal drive signals for the high and low side transistors.

10 Claims, 2 Drawing Sheets

GATE DRIVER WITH LEVEL SHIFT BETWEEN STATIC WELLS WITH NO POWER SUPPLY

CROSS REFERENCE TO RELATED APPLICATIONS

This application claims the benefit and priority of U.S. Provisional patent application Ser. No. 60/530,319 filed Dec. 16, 2003 entitled GATE DRIVER WITH LEVEL SHIFT BETWEEN STATIC WELLS WITH NO POWER SUPPLY, the entire disclosure of which is incorporated herein by reference.

BACKGROUND OF THE INVENTION

1. Field of the Invention

This invention relates to integrated circuit (IC) control terminal drivers for switching amplifiers and other switching applications having a split power supply and a floating input, and more specifically to such drivers in which the static well associated with the signal input circuitry includes no logic circuits and therefore does not require a power supply input for that portion of the chip.

The invention is described in the context of a Class D audio amplifier, but the invention also has utility in other switching applications in which + and − bus supplies are required for series connected power transistors such as MOSFETS or IGBTS used to drive a load from a common node between the transistors.

2. Relevant Art

The Class D amplifier is representative of many switching applications, amplifiers, in which a gate driver for a pair of high and low side switches must accommodate an input signal lying close to a ground potential between the high and low side bus voltages. In the construction of the required IC gate driver, there must be two isolated wells, one for driving the high side switch and the other for receiving the input signal.

Conventionally, logic circuits are required in both wells, and consequently, power supplies for both wells are also required. Since space and packaging costs are always a factor in ICS, any architecture which permits decreasing the size of the chip or otherwise permitting employment of a smaller or less expensive package can represent a significant commercial advantage.

SUMMARY OF THE INVENTION

The present invention meets the above-described need by level shifting the input signal directly to the low side portion of the IC via a high voltage switch. Since no logic circuitry is required for the input well, this eliminates the need for a separate power supply. This, in turn, eliminates one input to the IC, and in the case of a half bridge gate driver with a split power supply, permits the use of a smaller and less expensive 8-pin package. An amplifier or other product utilizing the control chip can thus constructed in a correspondingly smaller area.

It is accordingly an object of this invention to provide an improved control terminal driver IC for switching applications having a split power supply and a floating input.

It is a further object of the invention to provide such a driver IC in which the static well associated with the signal input circuitry includes no logic circuits and therefore does not require a power supply input for that portion of the chip.

It is a more specific object of the invention to provide a gate driver IC for a Class D audio amplifier in which the input signal is coupled directly to the low side through a high voltage switch, and therefore does not require a separate power supply input for the input well.

BRIEF DESCRIPTION OF THE DRAWINGS

Other features and advantages of the present invention will become apparent from the following description of the invention which refers to the accompanying drawings.

Throughout, like parts are given the same reference sign.

DETAILED DESCRIPTION OF THE INVENTION

Figure 1:
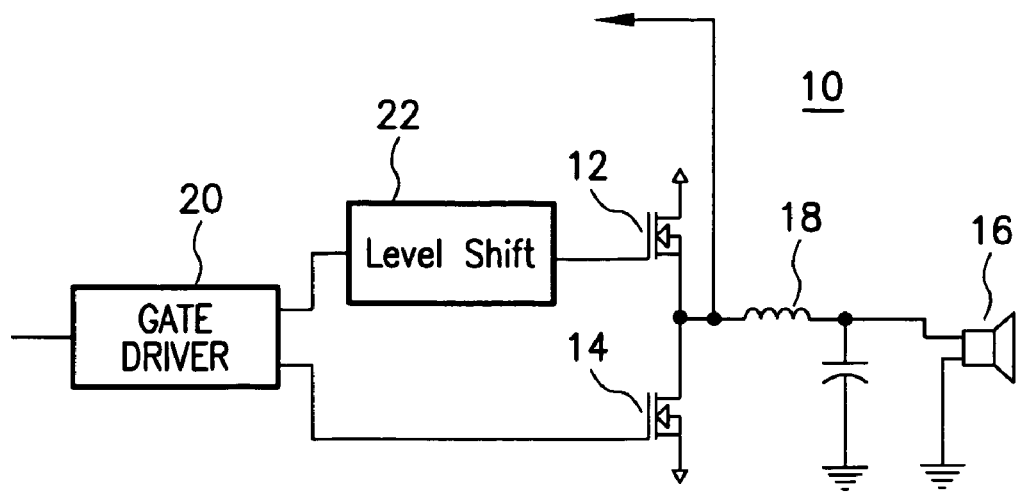
FIG. 1 shows a circuit diagram of the output stage of a class D amplifier having a conventional half bridge topology.

Referring first to FIG. 1, this shows in schematic form, a portion of a conventional class D amplifier 10 having a half-bridge topology with two MOSFET output transistors 12 and 14 connected in series between the high and low side busses (sometimes referred to as a totem pole configuration), driving a loudspeaker 16 though an LC filter 18. The PWM audio input signal is provided to a gate driver 20, which, together with a level shifter 22, includes the necessary logic, etc. to operate MOSFETS 12 and 14 alternatingly between a substantially fully conductive and a substantially fully non-conductive state.

Because MOSFETS 12 and 14 are either substantially fully on or substantially fully off except during the switching transitions, the class D amplifiers are known to exhibit low power consumption and high efficiency, as well as excellent audio frequency response and distortion values which are comparable to those of well designed audio amplifiers of other types.

Class D amplifiers have been known for almost 50 years, but are finding increasing utility in applications where high heat dissipation (due to high current usage) must be avoided, such as flat panel televisions, and where battery life must be maximized for economy and user convenience, such as in cell phones and other portable audio equipment. By eliminating one power supply input, and allowing reduced package size, the present invention enhances the attractiveness of Class D amplifiers for these applications.

Figure 2:
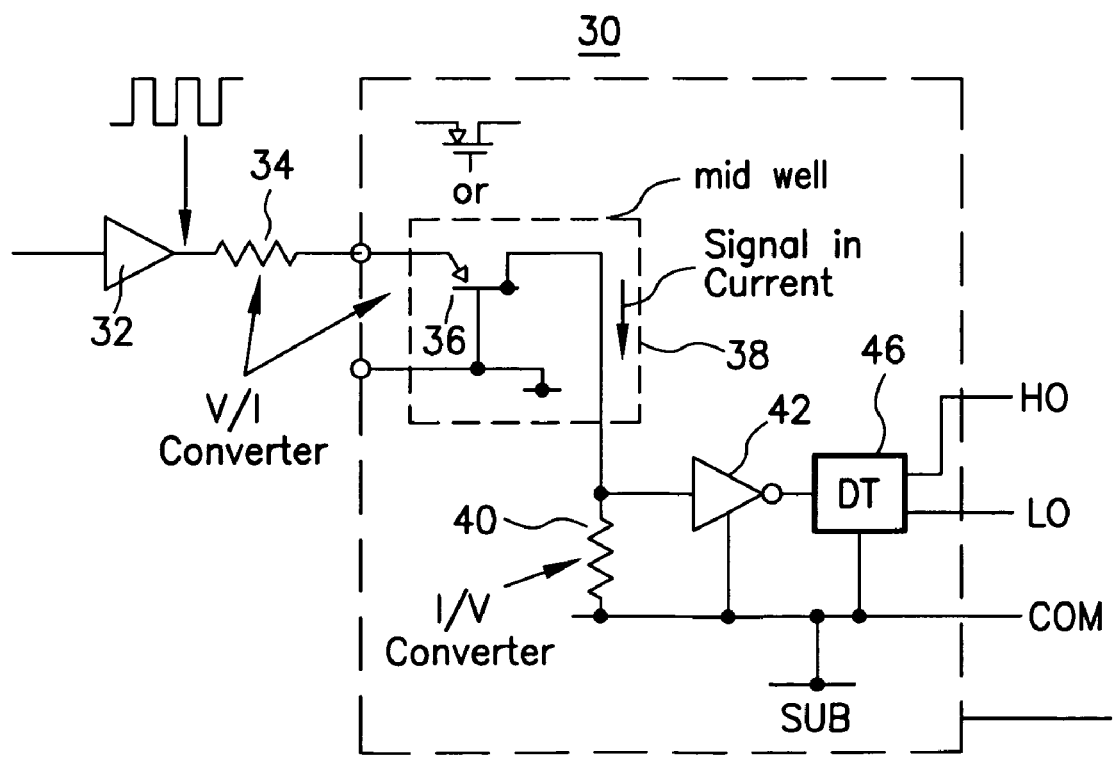
FIG. 2 shows a functional circuit diagram of a gate drive circuit according to one embodiment of the invention for use in a Class D amplifier as illustrated in FIG. 1 in which the audio input is in the form of a pulse width modulated (PWM) signal.

Referring now to FIG. 2, there is shown at 30, the essential features of a gate drive circuit for MOSFETS 12 and 14 shown in FIG. 1. In this embodiment, a PWM input signal voltage is provided through an input circuit 32 to a resistor 34 which converts the voltage into a current. This, in turn is coupled through a high voltage level shifter transistor 36 to the low side where it is recovered as a voltage across a resistor 40.

Since the high voltage level shifter transistor 36 is the only element in the mid well 38 formed in the IC die, no separate power supply input is required. The n-tub is biased by the input signal itself, as illustrated.

Still referring to FIG. 2, the voltage across resistor 40 is coupled through a buffer circuit 42 to a dead time circuit 46 which operates in a conventional manner to provide the gate drive signals $H_O$ and $L_O$ for the high and low side MOSFETS 12 and 14, respectively, through suitable buffers (not shown).

Figure 3:
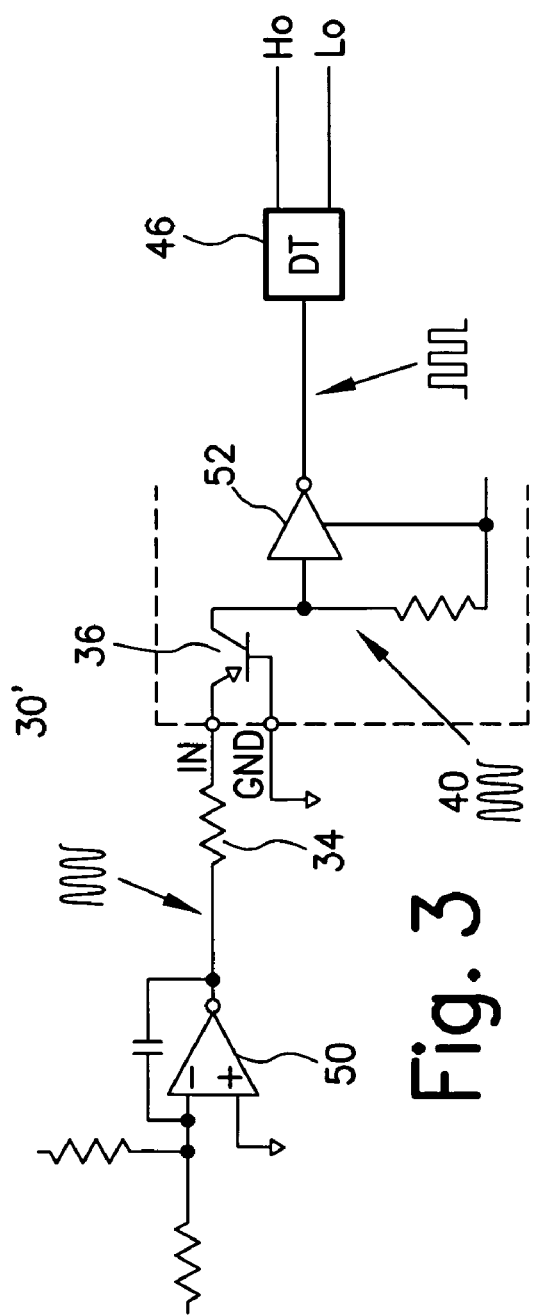
FIG. 3 shows another embodiment of the invention in which the audio input is in the form of a modulated analog signal.

FIG. 3 shows an alternative embodiment of a gate drive circuit 30' in which the input in the form of modulated analog signal coupled through an analog input circuit 50. Again, the input signal voltage is coupled through a resistor 34 which converts the voltage into a current, and a level shifter transistor 36 to the low side where it is recovered as a voltage across a resistor 40.

In this instance, the signal across resistor 40 is still in modulated analog form. It is therefore coupled through a differential comparator 52 to generate the PWM signal. This, in turn, is coupled to dead time circuit 46, as described above in connection with FIG. 2.

Figure 4:
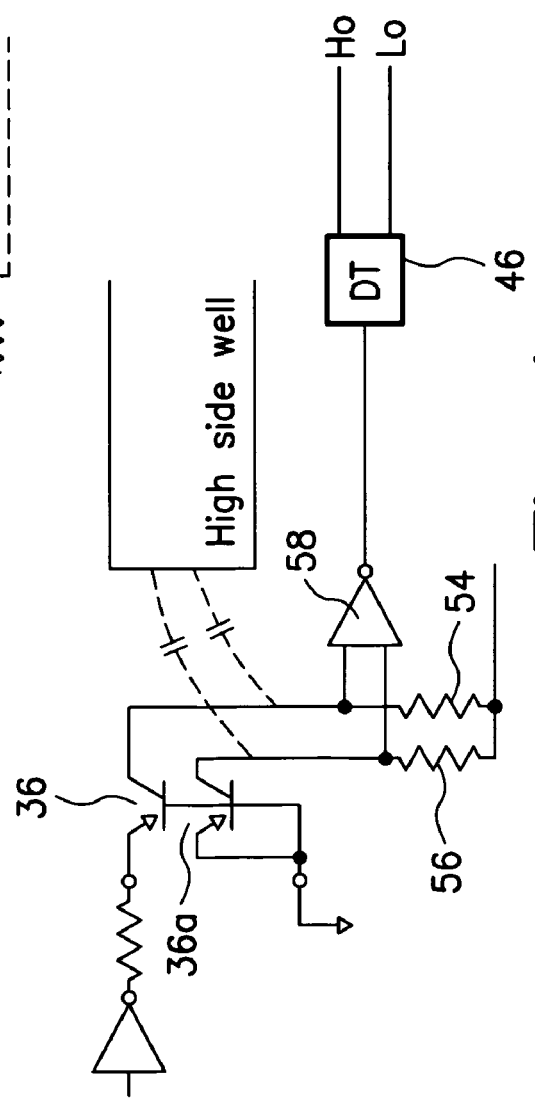
FIG. 4 shows a further embodiment in which two parallel stages are used to transmit the input signal in a differential mode.

A further variation is illustrated in Fig. 4. This arrangement helps reduce the influence of noise injected by stray capacitances between the switching node and the floating high side well. For this purpose, in addition to high voltage transistor switch 36 and resistor 54 which couples the input signal to the low side, there is provided a second parallel transistor 36a having its emitter grounded as illustrated. Transistor 36a is coupled to a second resistor 56 on the low side. The two resistors 54 and 56 thus transfer the input signal in a differential mode, and are coupled as inputs to a differential comparator 58. This, in turn, drives dead time circuit 46, as previously described.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A control terminal drive IC for a switching circuit having series connected high and low side output transistors, an associated split power supply and a floating input, the drive IC having a low side reference level, the IC comprising:
   an input circuit which receives an input signal;
   a voltage to current converter for converting a voltage of the input signal into a current and having an input connected to an output of the input circuit;
   a level shifter formed in a mid well of the IC, which has an input connected to an output of the voltage to current converter, the level shifter being operative to transfer the input signal so that it is referred to the low side reference level, a power supply input not being provided to the mid well;
   a current to voltage converter for converting an output of the lead shifts into a voltage and being coupled between the low side reference level and the output of the level shifter; and
   an output circuit coupled to an output of the level shifter and which is operative to receive the voltage and to generate control terminal drive signals for the high and low side transistors.

2. A control terminal drive IC as described in claim 1, wherein the input circuit is constructed to receive a PWM (pulse width modulation) input signal.

3. A control terminal drive IC as described in claim 1, wherein:
   the input circuit is constructed to receive a modulated analog input signal as the input signal; and
   the output circuit is operative to convert a modulated analog signal received as the voltage into a PWM signal.

4. A control terminal drive IC as described in claim 3, wherein the output circuit is a differential comparator.

5. A control terminal drive IC as described in claim 1, wherein:
   the voltage to current converter is a first resistor in series with the input of the level shifter;
   the current to voltage converter is a second resistor in series with the output of the level shifter; and
   the input to the output circuit is obtained across the second resistor.

6. A control terminal drive IC as described in claim 1, wherein the level shifter is a high voltage transistor.

7. A control terminal drive IC as described in claim 1, wherein the level shifter is a bipolar transistor.

8. A control terminal drive IC as described in claim 1, wherein an N-diffusion of the mid well is biased by the input signal.

9. A control terminal drive IC as described in claim 1, wherein the switching circuit is a Class D audio amplifier.

10. A control terminal drive IC as described in claim 1, wherein:
    the level shifter includes
       a first transistor having a current path connected between the input circuit and a first input of the output circuit;
       a second transistor having a current path connected between a ground point and a second input of the output circuit; and
    the output circuit is a differential comparator, wherein a noise resulting from stray capacitance from a switching node between the first and second transistors to a floating high side well is reduced.

* * * * *